(12) United States Patent
Chueh et al.

(10) Patent No.: US 9,127,356 B2
(45) Date of Patent: Sep. 8, 2015

(54) SPUTTERING TARGET WITH REVERSE EROSION PROFILE SURFACE AND SPUTTERING SYSTEM AND METHOD USING THE SAME

(75) Inventors: Chia-Liang Chueh, Chiayi (TW);
Kuo-Chou Chen, Zhubei (TW);
Ren-Dou Lee, Hsinchu (TW);
Hsien-Liang Meng, Tainan (TW);
Chun-Wei Lin, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 155 days.

(21) Appl. No.: 13/212,217

(22) Filed: Aug. 18, 2011

(65) Prior Publication Data

US 2013/0043120 A1    Feb. 21, 2013

(51) Int. Cl.
*C23C 14/35*    (2006.01)
*C23C 14/34*    (2006.01)
*H01J 37/34*    (2006.01)

(52) U.S. Cl.
CPC ............. *C23C 14/35* (2013.01); *C23C 14/3407* (2013.01); *H01J 37/3405* (2013.01); *H01J 37/3423* (2013.01); *H01J 37/3482* (2013.01)

(58) Field of Classification Search
CPC . C23C 14/35; C23C 14/3407; H01J 37/3405; H01J 37/3408; H01J 37/3423; H01J 37/3452
USPC ............................ 204/298.19, 298.12, 192.12
See application file for complete search history.

(56) References Cited

U.S. PATENT DOCUMENTS

| | | | | |
|---|---|---|---|---|
| 4,169,031 | A | * | 9/1979 | Brors ........................ 204/192.12 |
| 4,198,283 | A | | 4/1980 | Class et al. |
| 4,427,524 | A | * | 1/1984 | Crombeen et al. ....... 204/298.06 |
| 4,508,612 | A | * | 4/1985 | Blackwell et al. ........ 204/298.11 |
| 5,182,003 | A | * | 1/1993 | Maass et al. ............. 204/298.23 |
| 5,736,019 | A | * | 4/1998 | Bernick .................... 204/298.07 |
| 5,783,048 | A | * | 7/1998 | Hurwitt .................... 204/192.12 |
| 2003/0178301 | A1 | * | 9/2003 | Lynn et al. ............... 204/298.12 |
| 2004/0009087 | A1 | * | 1/2004 | Yi et al. ........................... 419/8 |
| 2009/0205949 | A1 | | 8/2009 | Zueger |
| 2011/0303535 | A1 | * | 12/2011 | Miller et al. ............. 204/298.13 |

FOREIGN PATENT DOCUMENTS

| | | | |
|---|---|---|---|
| JP | 06-140330 | * | 5/1994 |
| JP | 2007-224392 | * | 9/2007 |
| WO | WO 2009/151767 | * | 12/2009 |

OTHER PUBLICATIONS

Machine Translation JP 06-140330 dated May 1994.*
Machine Translation JP 2007-224392 dated Sep. 2007.*

* cited by examiner

*Primary Examiner* — Rodney McDonald
(74) *Attorney, Agent, or Firm* — Duane Morris LLP

(57) ABSTRACT

A sputtering target is provided that includes a planar backing plate and a target material formed over the planar backing plate and including an uneven sputtering surface including thick portions and thin portions and configured in conjunction with a sputtering apparatus such as a magnetron sputtering tool with a fixed magnet arrangement. The uneven surface is designed in conjunction with the magnetic fields that will be produced by the magnet arrangement such that the thicker target portions are positioned at locations where target erosion occurs at a high rate. Also provided is the magnetron sputtering system and a method for utilizing the target with uneven sputtering surface such that the thickness across the target to become more uniform in time as the target is used.

18 Claims, 4 Drawing Sheets

SPUTTERING TARGET WITH REVERSE EROSION PROFILE SURFACE AND SPUTTERING SYSTEM AND METHOD USING THE SAME

TECHNICAL FIELD

The disclosure relates to the field of magnetron sputter coating technology including magnetron sputtering systems, sputtering targets and methods for sputtering coatings onto substrates using physical vapor deposition.

BACKGROUND

Magnetron sputtering is commonly used to coat substrates with a thin film using physical vapor deposition, PVD. Sputter coating technology is used for producing thin films in, for example, the semiconductor industry, the optical industry, the data storage industry and also for producing functional films or coatings for other applications. Magnetron sputtering sources, more precisely magnetron cathode sputtering sources, are widely used because they provide high deposition rates. A semiconductor wafer used in the semiconductor manufacturing industry or other work piece used in other industries, is positioned in a processing chamber of a magnetron sputtering system, a sputtering target is affixed within the system and electrical and magnetic fields are generated to cause the target material to erode and the liberated target material to be directed to the semiconductor wafer or other work piece.

More particularly, in sputtering cathodes, the coating material provided in the form of a target is eroded by energetic ions from a plasma discharge and the material liberated by the ions forms a thin film coating on the substrate via physical vapor deposition, PVD. The plasma discharge is generally maintained in an evacuated process chamber, i.e. a vacuum chamber, under controlled flow of a working gas with an electric potential and discharge current applied by a power supply between the target cathode and an anode.

In the standard case of electrically conductive target materials, the target is supplied with a continuous or pulsating negative voltage, such that a plasma forms above the target surface. By means of an electrical field formed between the plasma and target surface, positively charged ions from the plasma are accelerated toward and onto the negatively biased target surface, i.e. the cathode, bombarding the target surface and causing erosion of the target by freeing material from the target and resulting in material being sputtered away from the target surface. The liberated material from the eroding target is directed from the cathode to a semiconductor substrate or other workpiece positioned on a support maintained at or near the anode potential thereby coating the semiconductor substrate or workpiece. For electrically non-conductive target materials, the plasma discharge is maintained using a high frequency supply leading to ion bombardment of the target pulsating with the high-frequency, thus resulting in a sputter erosion process of the target.

The material liberated from the target deposits on the substrate in approximately the same composition as present in the target.

In a magnetron sputtering system, the plasma density above the target is strongly increased by means of magnetic fields. Ions in the high plasma density region produced by the magnetic field, become highly energized. The magnetic fields are produced by an arrangement of magnets arranged in close proximity and in fixed position with respect to the target. The magnet arrangement is typically disposed on the side of the target opposite the target sputtering surface and outside the process chamber. When the magnetron sputtering system is in operation, the magnetic field lines produced by the magnet arrangement are in fixed location with respect to the magnets and with respect to the target since the target mount is in fixed position with respect to the magnet arrangement. The targets may take on various geometric shapes such as oval, circular, or rectangular. The substrate or substrates being coated may be in movement or stationary during the coating process.

In conventional magnetron sputtering systems, however, the target will have an uneven erosion profile. Regardless of its shape, the target erodes more preferentially at specific locations with respect to the fixed magnetic fields that are produced by the fixed magnet arrangement. When a magnet arrangement is located behind the target, the resulting magnetic field forms a closed-loop annular path acting as an electron trap that reshapes the trajectories of the electrons. The magnetic field lines created by the magnet arrangement determine the erosion pattern of the target because the electrons which create the plasma discharge are energized by the magnetic field and accelerated toward the target at a 90 degree angle relative to the magnetic field lines. Once the erosion profile has been established on the target surface, it remains constant throughout the life of the target.

The uneven erosion profile of the target can result in poor uniformity of the deposited film, i.e. coating.

The target actually consists of the target material that is to be sputtered as a coating, disposed on a backing plate which may be a ferromagnetic or other metallic material. When the spatially preferential erosion of particular locations on the target causes the target material to be completely consumed in these locations and the backing material exposed, problems arise. In particular, the material of the backing plate of the target becomes attacked by the plasma ions and can become eroded and undesirably form part of the coating. This contaminates the coating and the system. As such, the target must be changed prior to the target material being completely consumed at any one location. This results in the frequent disposal of targets that still include very thick portions of useable target material in the non-eroded portions, and is cost ineffective.

It is clear that it would be desirable to avoid this situation and to increase full target utilization, and also to ensure uniform coating on the substrates.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
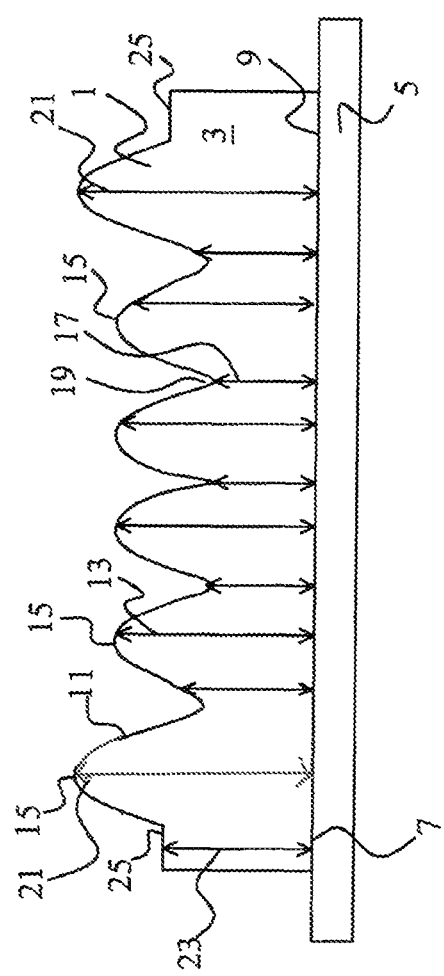
FIG. 1 is a cross-sectional view of an exemplary sputtering target.

Provided is a sputtering target with an uneven sputtering surface. The uneven sputtering surface essentially represents a reverse erosion profile surface. Also provided is a magnetron sputtering system including the sputtering target and a method for coating a film on a substrate using sputter deposition and a sputter target having the uneven sputtering surface.

The sputtering target is advantageously used in magnetron sputtering systems and is formed on a planar backing plate but includes an uneven sputtering surface including thick areas and thin areas. The uneven sputtering surface includes a thickness that varies gradually from the thick areas to the thin areas and may be described as having peaks and valleys in some exemplary embodiments. The target is constructed in conjunction with the particular magnetron sputtering system in which it will be used. The target may be configured and constructed in conjunction with any of various differently configured magnetron sputtering systems. Installed on the target mount in the magnetron sputtering system, the sputtering target is in fixed position with respect to the target mount, the magnetron sputtering system and the magnet arrangement that forms part of the magnetron sputtering system. The magnets of the magnet arrangement may be electromagnets or permanent magnets. Durasource magnets and G12 magnets represent two of the various exemplary magnet types that may be used in various exemplary embodiments, though the sputtering target and system may be used in conjunction with various other magnets in other exemplary embodiments.

The magnets of the magnet arrangement produce magnetic fields at predetermined locations and configurations with respect to the magnetic poles. The sputtering surface is produced to include thicker portions generally corresponding to the regions of high magnetic fields and between magnetic poles and thinner portions oriented over the magnetic poles and at locations of lower magnetic fields. The sputtering surface compensates for the erosion pattern of the target that will be produced by the sputtering system physics and electronics as determined by the magnetic fields as thicker portions correspond to regions where the target erosion rate is high and thinner portions correspond to regions where the target erosion rate is low.

The disclosure is applicable to various target shapes including square, rectangular, circular, oval or other target shapes used in semiconductor manufacturing, optics or other industries that utilize magnetron sputtering systems. The target may be a single, binary or ternary material. In various exemplary embodiments, the target material may be silver, Ag, gold, Au, palladium, Pd, copper, Cu, aluminum, Al, platinum, Pt, nickel, Ni, chromium, Cr, tantalum, Ta, titanium, Ti, aluminum copper, AlCu, tungsten, W, carbon, C, or other materials sputter deposited onto substrates. The sputtering targets may be utilized in conjunction with magnetron sputtering systems of various orientations and configurations and with various electromagnet and permanent magnet types and arrangements.

The disclosure also provides a magnetron sputtering system including the sputtering target and a method for coating a film on a substrate using sputter deposition in conjunction with the sputter target with an uneven sputter surface.

FIG. 1 is a cross-sectional view showing an exemplary sputtering target with an uneven sputtering surface and usable in a magnetron sputter deposition apparatus to coat a film with target material via physical vapor deposition, PVD, of the target material. FIG. 1 shows sputtering target 1 including target material 3 on backing plate 5. Backing plate 5 includes planar surface 7 and target material 3 includes a lower planar surface 9 in conterminous relationship with planar surface 7. Backing plate 5 may be formed of aluminum, or steel or various suitable ferromagnetic or other conductive materials and is formed of a different material than target material 3. Backing plate 5 may be attachable to a target mount. Sputtering target 1 may be a single, binary or ternary material and target material 3 may be any of the aforementioned materials or other materials used in sputter deposition systems to form coatings by way of physical vapor deposition. The cross-section shown in FIG. 1 may be representative of sputtering target 1 having various geometric shapes including round, oval, square and rectangular. Sputtering target 1 may be designed in conjunction with different chamber types and different magnet types and arrangements which will produce different magnetic fields.

Sputter surface 11 is an uneven surface that includes thicker portions 15 and thinner portions 19. Sputter surface 11 is a smooth surface that changes gradually from thicker portions 15 to thinner portions 19 and represents the reverse erosion profile as produced by the magnetron sputtering system in which sputtering target 1 will be used. Thickness 13 of thicker portions 15 may be 1 to 10 times as great as thickness 17 of thinner portions 19. Thicker portions 15 are shown to have different thicknesses, in particular thickness 13 and thickness 21 which is greater than thickness 13. This is exemplary only. In other exemplary embodiments, all of thicker portions 15 will include the same thickness. This is also true for thinner portions 19 as sputtering target 1 may be custom designed and produced such that thinner portions 19 include different thicknesses in various exemplary embodiments. Thickness 23 of flat surface 25 is for comparative purposes only and may represent the thickness and flat surface of a conventional sputtering target. Thickness 17 may be 1 mm or greater. Thickness 13 may be 100 mm or less according to various exemplary embodiments and will depend upon thickness 17 of thinner portions 19. The thickness of target material 3 changes gradually and smoothly from thickness 13 or thickness 21 of thicker portions 15, to thickness 17 at thinner portions 19.

Figure 2:
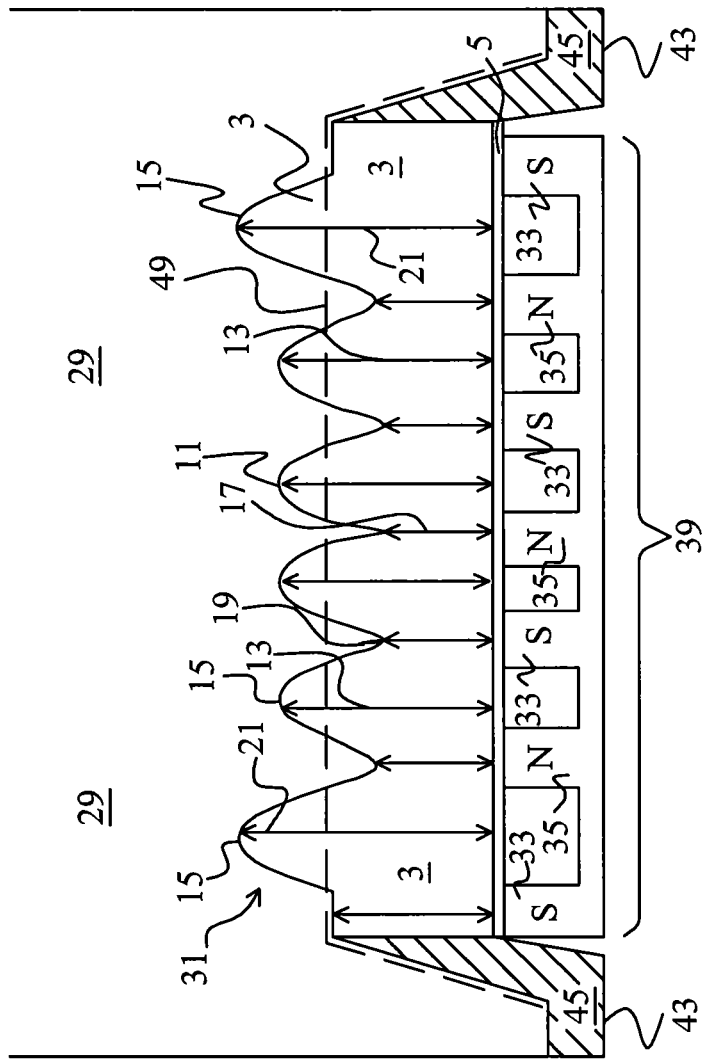
FIG. 2 is a cross-sectional view of an exemplary sputtering target positioned with respect to a magnet arrangement.

FIG. 2 shows another exemplary embodiment of a sputtering target with an uneven sputtering surface and shows exemplary sputtering target 31 disposed in a magnetron sputtering apparatus and positioned with respect to magnet arrangement 39. Sputtering target 31 includes backing plate 5 and legs 45 positioned on target mount 43. Backing plate 5 is coupled to legs 45 and it should be understood that the relative dimensions of target material 3 and backing plate 5 have been adjusted and are not necessarily to scale. Legs 45 are exemplary only and are provided to illustrate that a mechanical feature of sputtering target 31 is used to position sputtering target 31 in fixed position with respect to target mount 43. Sputter surface 11 includes thicker portions 15 and thinner portions 19. Thicker portions 15 include thicknesses 13 or 21 in the illustrated embodiment and thinner portions 19 include thickness 17 in the illustrated embodiment. Dashed line 49 is shown for comparative purposes and may represent a planar upper surface of a conventional sputtering target.

Magnet arrangement 39 includes a plurality of magnets. The magnets may be various types of magnets and they may be electromagnets or permanent magnets. Magnet arrangement 39 includes a plurality of poles including south magnetic poles 33 and north magnetic poles 35. The spacing between north magnetic poles 35 and south magnetic poles 33 is exemplary only. In other exemplary embodiments, other spacings may be used and other numbers of magnetic poles may be utilized. Thicker portions 15 are positioned between south magnetic poles 33 and north magnetic poles 35 and thinner portions 19 are disposed over one of the magnetic poles. As will be described infra, due to the magnetic fields created by the magnets of magnetic arrangement 39, the erosion of sputtering target 31 will have a faster rate at thicker portions 15 between the magnetic poles, than at thinner portions 19 and the continued use of sputtering target 31 in a magnetron sputtering system will gradually cause sputter surface 11, which is markedly uneven in the illustrated embodiment, to have an increasingly more uniform thickness.

Sputtering target 31 is disposed within process chamber 29 which is a sputtering chamber in a magnetron sputtering apparatus and may advantageously be a vacuum chamber which also includes a substrate therein. (See FIG. 4). Sputtering target 31 is shown in cross-sectional view and the configuration and orientation of north and south magnetic poles 35, 33 may take on various configurations as they extend into and out of the plane of the drawing page. The orientation of the exemplary magnetic fields produced by magnetic arrangement 39 can vary similarly. Sputtering target 31 is designed such that thicker portions 15 and thinner portions 19 follow the configuration of magnetic arrangement 39 as described supra. In one exemplary embodiment, in which sputtering target 31 is generally round, the north and south poles may extend arcuately or circularly beneath sputtering target 31 such that each of thinner portions 19 and thicker portions 15 extend concentrically in a circle. Another exemplary arrangement is shown in FIG. 3.

Figure 3:
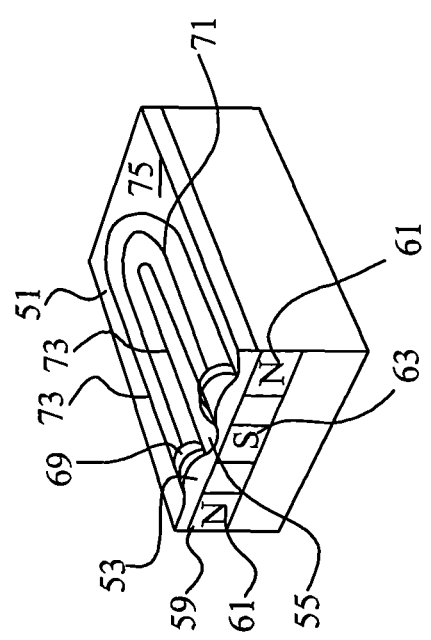
FIG. 3 is a cross-sectional and perspective view of an exemplary target disposed over a magnet arrangement and resulting magnetic field.

FIG. 3 shows a perspective view in partial cross-section of sputtering target 51 including thicker portions 53 and thinner portions 55. Sputtering target 51 is generally rectangularly shaped and is disposed on backing plate 59 which, in turn, is disposed on a magnetic arrangement which includes north magnetic poles 61 and south magnetic poles 63. The magnetic arrangement is intended to be exemplary only. The magnetic arrangement may be formed of electromagnets or permanent magnets in various exemplary embodiments. The magnetic arrangement provides magnetic field 69 that is a closed loop arc-shaped magnetic field in cross-section and that extends from pole to pole. The arc-shaped magnetic field includes crest 71 and base section 73 in its cross section and extends annularly about uneven top surface 75 of sputter target 51. Magnetic field 69 may extend in a racetrack-like configuration with respect to uneven sputter surface 75 such as in the arrangements shown in cross section in FIG. 3. Although not clearly distinguishable in FIG. 3, thicker portions 53 and thinner portions 55 may essentially extend around sputtering target 51 in the same racetrack-like configuration as magnetic field 69 with thicker portions 53 and thinner portions 55 corresponding to the portions of magnetic field 69 as described supra.

In other exemplary embodiments, the magnetic field may take on different configurations and is advantageously formed by magnets placed in close proximity to the target such that the magnetic field extends above the uneven sputtering surface.

Figure 4:
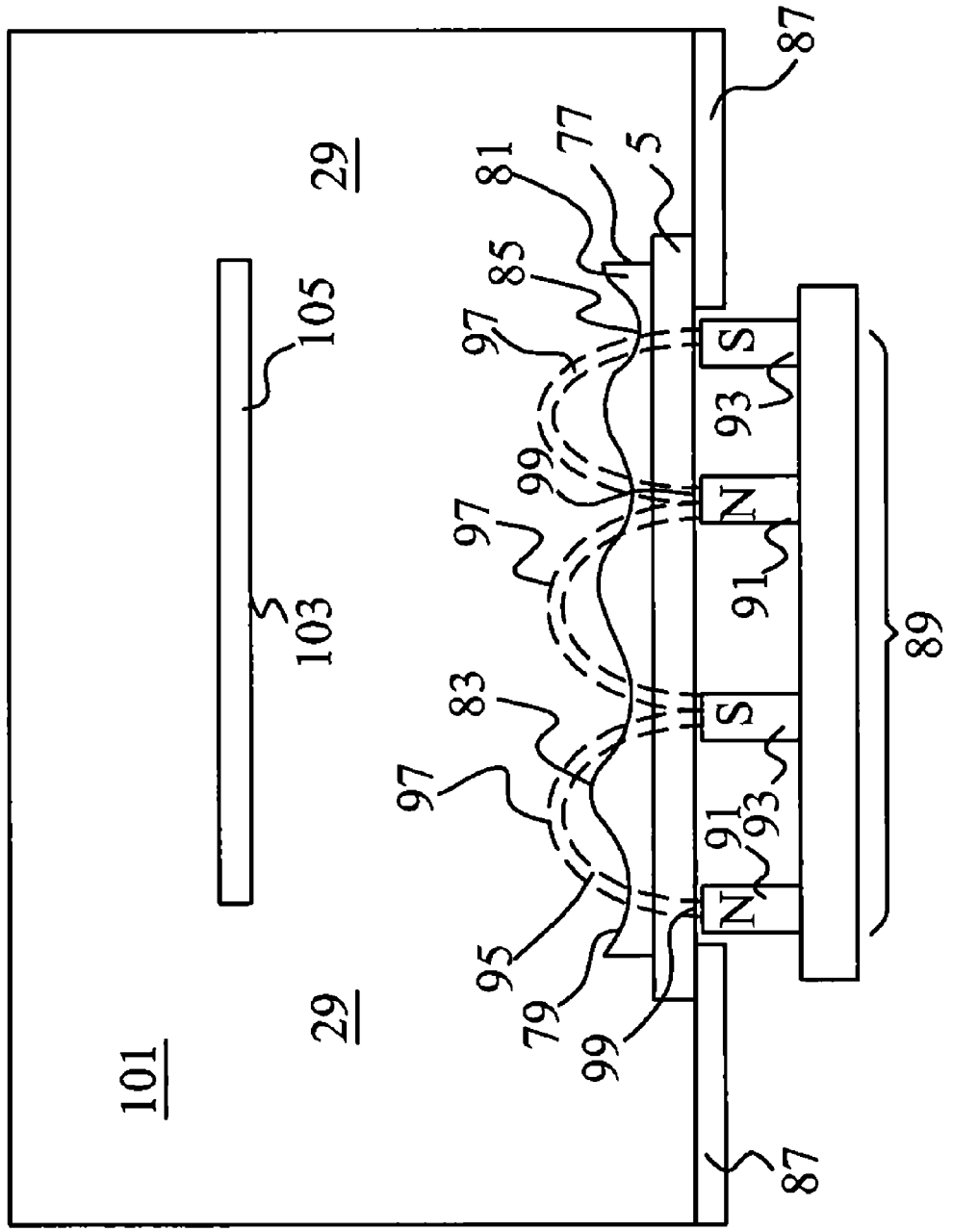
FIG. 4 is a cross-sectional view of an exemplary target disposed over a magnet arrangement and resulting magnetic field, within a processing chamber.

FIG. 4 shows sputtering target 77 with uneven sputtering surface 79. Sputtering material 81 and sputtering surface 79 include thick portions 83 and thin portions 85. In exemplary sputtering target 77, it can be seen that each of thick portions 83 have substantially the same thickness and each of thin portions 85 have substantially the same thickness. When sputtering target 77 is disposed on target mount 87, it is in fixed position in magnetron sputtering system 101 and in fixed position with respect to magnet arrangement 89 including north magnetic poles 91 and south magnetic poles 93 which may be part of an electromagnet or permanent magnet and which produce magnetic field 95. Magnetic field 95 is a closed loop annular path with an arc-shaped cross section including crests 97 and base portions 99 and magnetic field 95 extends above uneven sputtering surface 79 when sputtering target 77 is disposed on target mount 87. Sputtering target 77 is designed in conjunction with the known configuration of magnetron sputtering system 101 such that when it is properly mounted on target mount 87, it is in fixed position with respect to the aforementioned components and such that thick portions 83 are positioned at locations of high target erosion rates and between north magnetic poles 91 and south magnetic poles 93.

With the magnetic fields present and the magnetron sputtering system powered on to generate a plasma that causes target material 81 to be sputtered from sputtering target 77, a coating is formed on surface 103 of substrate 105 disposed in processing chamber 29 according to known methods for magnetron sputtering. Substrate 105 may be disposed on a substrate holder, not shown, and may be in fixed position during the magnetron sputtering operation or it may be in movement during the sputter deposition operation to produce a uniform coating.

An aspect of the present arrangement, is that thicker portions 83 erode at a faster rate than thinner portions 85 because of the spatially preferential erosion pattern created due to magnetic fields 95 and as a result of magnetic arrangement 89. As the system is operated and substrates are coated, sputtering material 81 is preferentially sputtered at a higher rate from thicker areas 83 which results in uneven sputtering surface 79 becoming more uniform and even as the target is used and consumed. Eventually, the thickness will be substantially even across sputtering target 77 as the thickness is minimized and sputtering target 77 can be removed from the system when a substantially uniformly thin film of sputtering material 81 remains over backing plate 5 of sputtering target 77, but no exposed portions of backing plate 5 are present due to the erosion pattern of the magnetron sputtering system as influenced by magnetic arrangement 89.

According to one aspect, a sputtering system is provided. The sputtering system is for sputtering films onto semiconductor substrates using physical vapor deposition. The sputtering system comprises a magnetron sputtering apparatus including a target mount for mounting a target, a magnet arrangement including a plurality of north and south magnetic poles positioned in fixed position with respect to the target mount and a sputtering target mountable on the target mount. The sputtering target includes target material with an uneven sputtering surface including thinner target material portions oriented over the north and south magnetic poles when the sputtering target is positioned on the target mount and thicker target material portions oriented between the north and south magnetic poles when the sputtering system is positioned on the target mount.

According to another aspect, a sputtering target is provided. The sputtering target is useable in conjunction with a magnet arrangement in a magnetron sputtering system and comprises a target material disposed over a planar backing plate, the target material having an uneven upper sputtering surface including thicker portions and thinner portions.

According to another aspect, a method for coating substrates by magnetron sputtering is provided. The method comprises providing a magnetron sputtering system, providing a sputtering target having an uneven sputtering surface with thicker portions and thinner portions of target material, generating at least one magnetic field and positioning the sputtering target in the magnetron sputtering system such that the thicker portions are oriented between poles in the magnetic field and such that the thinner portions are positioned at locations corresponding to the north and south magnetic poles.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In particular, while the relative orientation of the target with respect to the magnetic field produced by the magnet arrangement is important, the illustration and description of the target being disposed "over" the horizontally disposed magnet arrangement is exemplary only and various magnetron sputtering systems may include one or more targets positioned in different orientations in the system.

Furthermore, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A system comprising:
 a magnetron sputtering apparatus including a magnet arrangement including an electromagnet;
 a sputtering target comprising a target material disposed over a planar flat backing plate, said flat backing plate joined to legs that extend both alongside said target material and beneath said flat backing plate and said target material having an uneven upper sputtering surface including thicker portions comprising peaks and thinner portions comprising valleys, said target material having a thickness that varies continuously between said peaks and said valleys and no centrally disposed flat portions,
 said thinner portions positioned over magnetic poles of said magnet arrangement in said magnetron sputtering apparatus and said thicker portions positioned between magnetic poles of said magnet arrangement in said magnetron sputtering apparatus.

2. The system as in claim 1, wherein said target material includes a planar bottom surface conterminous with said flat backing plate.

3. The system as in claim 1, wherein said sputtering target includes said peaks and said valleys each extending in a racetrack-like configuration.

4. The system as in claim 1, wherein said sputtering target is circular in shape and wherein each said thinner portion and each said thicker portion extends arcuately around said sputtering target.

5. The system as in claim 1, wherein said sputtering target is a binary material and includes at least two of silver, gold, palladium, copper, aluminum, platinum, nickel, chromium, tantalum, titanium, aluminum copper, tungsten, and carbon.

6. The sputtering target system as in claim 1, wherein said thicker portions include a plurality of different thicknesses and said thinner portions include a plurality of different thicknesses.

7. A sputtering system for sputtering films onto semiconductor substrates using physical vapor deposition, PVD, said sputtering system comprising:
 a magnetron sputtering apparatus including a target mount for mounting a target;
 a magnet arrangement including an electromagnet with a plurality of north and south magnetic poles positioned in fixed position with respect to said target mount; and
 a sputtering target disposed on a flat backing plate that is coupled to legs that extend above and below said flat backing plate,
 said sputtering target including target material with an uneven sputtering surface including thinner target material portions forming valleys and oriented over said north and south magnetic poles when said legs are positioned on said target mount, and thicker target material portions comprising peaks and oriented between said north and south magnetic poles when said legs are positioned on said target mount, said target material having a thickness that varies continuously between said peaks and valleys and no centrally disposed flat portion.

8. The sputtering system as in claim 7, wherein said sputtering target includes said target material including a lower planar surface disposed directly on a planar surface of said flat backing plate.

9. The sputtering system as in claim 8, wherein said thicker target material portions include a thickness about 2-10 times as great as a thickness of said thinner target material portions.

10. The sputtering system as in claim 7, wherein said magnetron sputtering apparatus further comprises a process chamber wherein said sputtering target and said target mount are disposed in said process chamber, said magnet arrangement is disposed outside of said process chamber and further comprising a substrate disposed on a movable substrate holder within said process chamber.

11. The sputtering system as in claim 7, wherein said thicker target material portions correspond to high target erosion rate locations and said thinner target material portions correspond to low target erosion rate locations when said sputtering target is mounted on said target mount.

12. The sputtering system as in claim 7, wherein said thicker target material portions include a plurality of different thicknesses and said thinner target material portions include a plurality of different thicknesses.

13. A method for coating substrates by magnetron sputtering, said method comprising:

providing a sputtering target having an uneven upper sputtering surface with thicker portions and thinner portions of target material, in a magnetron sputtering system, said thicker portions forming peaks and said thinner portions forming valleys and said target material having a thickness that varies continuously between said peaks and said valleys and no centrally disposed flat portion, said sputtering target having a planar lower surface opposite said uneven upper sputtering surface and disposed on a flat backing plate;

generating at least one magnetic field using an electromagnet; and positioning said sputtering target in said magnetron sputtering system by joining said flat backing plate to a target mount using legs affixed to said backing plate, such that said thicker portions are oriented between poles in said magnetic field and such that said thinner portions are positioned at locations corresponding to north and south magnetic poles of said magnetic field, wherein said legs extend both above and below said flat backing plate.

14. The method as in claim 13, further comprising sputtering so as to produce a target erosion rate that is greater at said thicker portions than at said thinner portions.

15. The method as in claim 13, wherein said generating at least one magnetic field comprises generating at least one magnetic field having an arc-shaped cross-section extending through said sputtering target, said arc-shaped cross-section including base sections and a crest and wherein said positioning comprises positioning said thicker portions at said crests and said thinner portions at said bases.

16. The method as in claim 13, further comprising evening out said uneven sputtering surface by sputtering said target material from said uneven sputtering surface onto a substrate surface.

17. The method as in claim 16, wherein said magnetron sputtering system includes a processing chamber with said sputtering target and said substrate surface therein and wherein said generating at least one magnetic field includes positioning a magnet arrangement including said electromagnet, outside of said process chamber.

18. The method as in claim 13, wherein said thicker portions include a thickness at least two times as great as a thickness of said thinner portions.

* * * * *